(12) United States Patent
Ohmi et al.

(10) Patent No.: US 6,217,633 B1
(45) Date of Patent: Apr. 17, 2001

(54) METHOD AND APPARATUS FOR RECOVERING RARE GAS

(75) Inventors: Tadahiro Ohmi, 2-1-17-301, Komegafukuro, Aoba-ku, Sendai-shi, Miyagi 980-0813; Yoshio Ishihara, Tokyo, both of (JP)

(73) Assignees: Nippon Sanso Corporation, Tokyo; Tadahiro Ohmi, Miyagi, both of (JP)

( * ) Notice: Subject to any disclaimer, the term of this patent is extended or adjusted under 35 U.S.C. 154(b) by 0 days.

(21) Appl. No.: 09/355,556
(22) PCT Filed: Nov. 27, 1998
(86) PCT No.: PCT/JP98/05335
§ 371 Date: Jul. 30, 1999
§ 102(e) Date: Jul. 30, 1999
(87) PCT Pub. No.: WO99/28023
PCT Pub. Date: Jun. 10, 1999

(30) Foreign Application Priority Data

Dec. 1, 1997 (JP) ................................ 9-330228

(51) Int. Cl.[7] ................................ B01D 53/04
(52) U.S. Cl. ............ 95/8; 95/19; 95/127; 96/111; 96/113; 96/144
(58) Field of Search ............ 95/1, 8, 11, 12, 95/19, 22, 90, 127; 96/108, 109, 111, 113, 143, 144

(56) References Cited

U.S. PATENT DOCUMENTS

| | | | |
|---|---|---|---|
| Re. 35,725 | * | 2/1998 | Briesacher et al. ............ 96/108 X |
| 3,887,339 | * | 6/1975 | Robertson ............................ 95/11 |
| 4,292,052 | * | 9/1981 | Cardullo ............................... 94/11 |
| 4,674,443 | | 6/1987 | Furukawa et al. .............. 118/733 |
| 4,676,999 | | 6/1987 | Furukawa et al. .............. 427/250 |
| 5,080,693 | * | 1/1992 | Bourne et al. ........................ 95/8 |
| 5,230,721 | * | 7/1993 | Ohmi ............................... 95/90 X |
| 5,259,868 | * | 11/1993 | Doubrawa et al. ................ 95/12 |
| 5,707,424 | * | 1/1998 | Tom et al. ....................... 95/127 X |
| 5,925,167 | * | 7/1999 | Smith .................................. 95/11 |
| 5,928,415 | * | 7/1999 | Girard et al. .................. 96/113 X |
| 5,993,766 | * | 11/1999 | Tom et al. ..................... 95/90 X |

FOREIGN PATENT DOCUMENTS

| | | |
|---|---|---|
| 1239060 | 7/1988 | (CA) . |
| 85 1 07585 | 5/1987 | (CH) . |
| 0 175 640 | 3/1986 | (EP) . |
| 0 757 918 A2 | 2/1997 | (EP) . |
| 63-239105 | 5/1988 | (JP) . |
| 2-25989 | 6/1990 | (JP) . |
| 06314680 | * 11/1994 | (JP) ..................................... 95/8 |
| 9-29002 | 2/1997 | (JP) . |
| 9-251981 | 9/1997 | (JP) . |
| 97-6542 | 2/1987 | (KR) . |
| 89-4618 | 11/1989 | (KR) . |

OTHER PUBLICATIONS

European Search Report dated Mar. 21, 2000.

* cited by examiner

Primary Examiner—Robert H. Spitzer
(74) Attorney, Agent, or Firm—Armstrong, Westerman, Hattori, McLeland & Naughton LLP

(57) ABSTRACT

A process and an apparatus for recovering a noble gas, which can recover a noble gas exhausted from a noble gas employing system efficiently and also can supply the noble gas of a predetermined purity to the noble gas employing system and which can reduce consumption of the noble gas. In the process and apparatus for recovering a noble gas, when a noble gas contained in an exhaust gas exhausted from a noble gas employing system operated under reduced pressure is recovered, switching between introduction of the exhaust gas to a recovery system and exhaustion of the exhaust gas to an exhaust system is carried out under reduced pressure, and this switching operation is carried out depending on the content of impurity components contained in the exhaust gas or on the running state of the noble gas employing system.

8 Claims, 5 Drawing Sheets

METHOD AND APPARATUS FOR RECOVERING RARE GAS

TECHNICAL FIELD

The present invention relates generally to a process and an apparatus for recovering a noble gas, more particularly to a process and an apparatus for recovering a noble gas contained in an exhaust gas from a noble gas employing system, for example, a plasma sputtering system, a plasma CVD system and a reactive ion etching system.

In processes for producing semiconductor devices such as semiconductor integrated circuits, active matrix liquid crystal panels, solar cell panels and magnetic discs, employed are systems for generating plasma in a noble gas atmosphere under reduced pressure to carry out various treatments of the semiconductor devices with the plasma, for example, a sputtering system, a plasma CVD system and a reactive ion etching system.

For example, in the sputtering system, a chamber is evacuated by a vacuum pump while a noble gas is introduced into the chamber at a flow rate of about 500 cc/min; and a high-frequency wave (radiofrequency) is applied to electrodes housed in the chamber with the internal pressure of the chamber being maintained to about 1 Pa to generate plasma which is used for sputtering of a solid film-forming material contained in the chamber to deposit it on the wafer surface and form a thin film.

Meanwhile, in the plasma CVD system, plasma is generated while a mixture of a film-forming gas and a noble gas is introduced into a process chamber at a flow irate of about 100 cc/min with the internal pressure of the chamber being maintained to about 100 Pa, and the thus generated plasma is used for decomposition of the film-forming gas to be deposited onto the surface of a wafer heated to about 300° C. and form a thin film.

Further, in the reactive ion etching system, plasma is generated while a mixture of an etching gas and a noble gas is introduced into a process chamber with the internal pressure of the chamber being maintained to about several Pa, and the thus generated plasma is used for excitation of the etching gas and to carry out etching using the excited ion.

In these various kinds of systems, since the treatments are carried out using plasma having high energy, energy, the presence of other gas species than those which contribute to film formation, for example, nitrogen, oxygen and moisture, in the atmosphere used for treatment makes it impossible to form a predetermined thin film or to carry out etching. For example, in the case where formation of metal wiring for semiconductor integrated circuits is carried out using the sputtering system, if moisture, oxygen or the like is present in the atmosphere, the metal thin film is oxidized to increase the wiring resistance. In the case of tantalum (Ta), the crystal structure can be changed. Further, if oxygen, moisture, organic impurity or the like is present in the atmosphere of forming a polycrystalline silicon thin film by means of plasma CVD, there occur various inconveniences: the resulting crystal grains have nonuniform size; and electron mobility is extremely lowered. If such impurities are present when etching is carried out by means of reactive ion etching, the desired selectively etching ratio of materials cannot be designed accurately, resulting in etching failure or damage of wafers. Accordingly, the impurity content in the noble gas to be introduced to a plasma-employing system should be reduced to several ppb or less.

FIG. 4 is a system diagram showing a conventional sputtering system as an example of plasma treating system.

Usually, in such a sputtering system, a loading chamber 3 for loading wafers 2 is installed on the upstream side of a process chamber 1, and the wafers 2 are treated one by one. The inside of the loading chamber 3 is of an atmosphere of a purge gas such as dry air and nitrogen gas supplied from a purge gas source 4 and is also maintained under reduced pressure by a pair of evacuators 6a and 6b connected to the loading chamber 3 via a gate valve 5. After evacuation of the loading chamber 3 and process chamber 1, the untreated wafer 2 supported in the loading chamber 3 is introduced into the process chamber 1 through a gate valve 7 interposed between these chambers 1 and 3 and is mounted on a wafer susceptor 8 in the process chamber.

After the gate valve 7 interposed between the chamber 1 and the chamber 3 is closed, a noble gas having passed a purifier 9 where impurities are removed is introduced from a gas source 10, through a line 10a, into the process chamber 1. Usually, in order to form a noble gas atmosphere in the process chamber 1, the cycle of evacuating the process chamber by the evacuators 11a and 11b and introducing the noble gas from the gas source 10 is repeated once or more by opening and closing the valves in a predetermined order in accordance with the commands from a controller 12. After formation of noble gas atmosphere in the process chamber, plasma is generated in the process chamber by application of a high-frequency wave from a high-frequency power source 14 via a matching circuit 13 to sputter a solid film-forming material with the plasma generated and deposit a thin film on the wafer. The wafer 2 having a predetermined thin film formed thereon is forwarded from the process chamber 1 through the loading chamber 3 to a subsequent step for another treatment. Loading and unloading of wafers are carried out about 30 times/hour as described above.

By the way, the exhaust gas let out from the sputtering system by the evacuators 11a and 11b, no matter whether it is a purge gas for the process chamber or is a gas used for film formation, is exhausted out of the system as such through an exhaust passage 15. Meanwhile, the noble gas supplied from a noble gas tank 16 is of the kind which is present in the atmosphere in a very small amount: xenon content in the atmosphere is 0.086 ppm. Since such noble gases are prepared by cryogenic separation of air to form a concentrated oxygen, followed by fractionation, they are not readily available in large amounts.

Accordingly, the exhaust gas to be exhausted through the exhaust passage 15 to the outside of the system (the exhaust gas at the point of time where the noble gas occupies the greatest part) is recovered to a container or balloon installed separately, and the thus recovered gas is subjected to concentration and fractionation to separate the noble gas therefrom for recirculation. According to this recovery process, since the exhausted noble gas is recovered into a container, a balloon or the like, the concentrated and fractionated noble gases can be utilized in various fields of industries advantageously. However, there occurs another problem that costs for transporting the containers and balloons in which noble gases are recovered increase. Further, atmospheric components readily migrate into the noble gases during attachment and detachment of the containers, noble gases having stable purity cannot be obtained when they are concentrated and fractionated, disadvantageously.

FIG. 5 is a system diagram showing an example where the conventional noble gas recovering apparatus is applied to the sputtering system shown in FIG. 4. More specifically, there is also proposed, in the conventional noble gas recovering apparatus, a process for recovering a noble gas contained in an exhaust gas (the exhaust gas at the time point where the noble gas occupies the greatest part of it) to be exhausted from a process chamber, through a closed loop, as shown in FIG. 5. According to this process, a recovery passage 23 connected to a noble gas recovering apparatus 22 is installed on an exhaust passage 15 of a sputtering system 21 having the same constitution as described above, while an outlet passage 24 of the noble gas recovering apparatus 22 is connected to the purifier 9, and the exhaust gas (noble gas) discharged from a process chamber 1 is designed to be introduced to the noble gas recovering apparatus 22 by opening and closing interchangeably a pair of selector valves 25a and 25b located on the recovery passage 23 and the exhaust passage 15 respectively. The noble gas introduced to the noble gas recovering apparatus 22 is compressed to a predetermined pressure by a compressor 27 having a bypass 26 and is combined with a noble gas supplemented suitably from a noble gas tank 16. The combined gas is then fed to a purifier 9 to be purified there and is fed back for recirculation.

However, according to this method, diffused impurities tend to migrate from the loading chamber 3 into the process chamber 1 during loading and unloading of wafers 2, and the impurity content in the process chamber 1 fluctuates with loading and unloading of wafers 2. Accordingly, the purity of the noble gas immediately after introduction also fluctuates, so that it is difficult to optimize the timing of recovering the noble gas which is carried out by opening and closing the selector valves 25a and 25b by the controller 12. Further, the exhaust gas is designed to be recovered through the exhaust passage 15 on the downstream side of the downstream evacuator (back pump) 11b. Since the pressure of this portion, i.e. the pressure on the downstream side of the downstream back pump 11b, is atmospheric, the flow rate of the gas drops suddenly to allow not only the noble gas but also the impurity components to be liable to dwell in the back pump and on the downstream side thereof. In this case, the dwelling gas and impurity components must be purged out of the system by a large amount of noble gas, and it has been impossible in the recovering apparatus 22 as shown in FIG. 5 to recover the noble gas in high efficiency. There have been inconveniences, when the impurity component dwelling in the back pump 11b and on the downstream side thereof and the purge noble gas are recovered as such, that the life of the purifier 9 is extremely reduced due to the increased absolute amount of impurity and that the purity of the noble gas is lowered.

It is an objective of the present invention to provide a process and an apparatus for recovering a noble gas which enables high-efficiency recovery of a noble gas exhausted from a noble gas employing system such as a plasma treating system which uses a noble gas under reduced pressure and which can supply a predetermined purity of noble gas stably to the noble gas employing system and can reduce consumption of the noble gas.

DISCLOSURE OF THE INVENTION

In order to attain the above objective, according to a first process for recovering a noble gas of the present invention, an operation of switching between introduction of the exhaust gas to a recovery system and exhaustion of the exhaust gas to an exhaust system is carried out depending on the content of impurity components contained in the exhaust gas, when a noble gas contained in an exhaust gas exhausted from a noble gas employing system operated under reduced pressure is recovered.

Incidentally, the noble gas referred to in the present invention is xenon (Xe), argon (Ar), krypton (Kr), neon (Ne) or a mixture of two or more of such gases.

Meanwhile, according to a second process for recovering a noble gas of the present invention, introduction of the exhaust gas to a recovery system and exhaustion of the exhaust gas to an exhaust system is carried out under reduced pressure, when a noble gas contained in an exhaust gas exhausted from a noble gas employing system operated under reduced pressure is recovered. Further, this switching operation is carried out depending on the content of impurity components contained in the exhaust gas or on the running state of the noble gas employing system.

A noble gas recovering apparatus according to the present invention has a noble gas employing system operated under reduced pressure; a first evacuator for sucking an exhaust gas let out from the noble gas employing system; a second evacuator disposed in series on the downstream side of the first evacuator via a pressure reducing line; a recovering line branching out of the pressure reducing line via line switching means; a recovery vacuum pump located on the recovering line; a compressor for compressing a recovered gas delivered from the recovery vacuum pump; a buffer tank for storing the thus compressed recovered gas; a purifier which removes impurities in the recovered gas let out from the storage tank to purity the noble gas; and a noble gas supply line for supplying the purified noble gas to the noble gas employing system. Further, a detoxicator for detoxicating target harmful components contained in the recovered gas let out from the recovery vacuum pump is interposed between the recovery vacuum pump and the compressor. In addition, an impurity content detector is disposed on the downstream side of the detoxicator, and an exhaust line for exhausting the recovered gas depending on the impurity content measured is branched via line switching means out of a passage between the impurity content detector and the compressor. The buffer tank is provided with a pressure detector; whereas the apparatus is further provided with a noble gas supplementing device for introducing the noble gas into the buffer tank depending on the value detected by the pressure detecting means.

According to the present invention, a noble gas contained in an exhaust gas let out from a noble gas employing system such as a plasma treating system can be recovered in high efficiency, and the noble gas can be recirculated inexpensively in a necessary amount and with a necessary purity. Further, since the noble gas is recovered under measurement of its impurity content, the recovery efficiency can be improved, and the purifier for removing impurities can get rid of excessive loads.

BEST MODE FOR CARRYING OUT THE INVENTION

Figure 1:
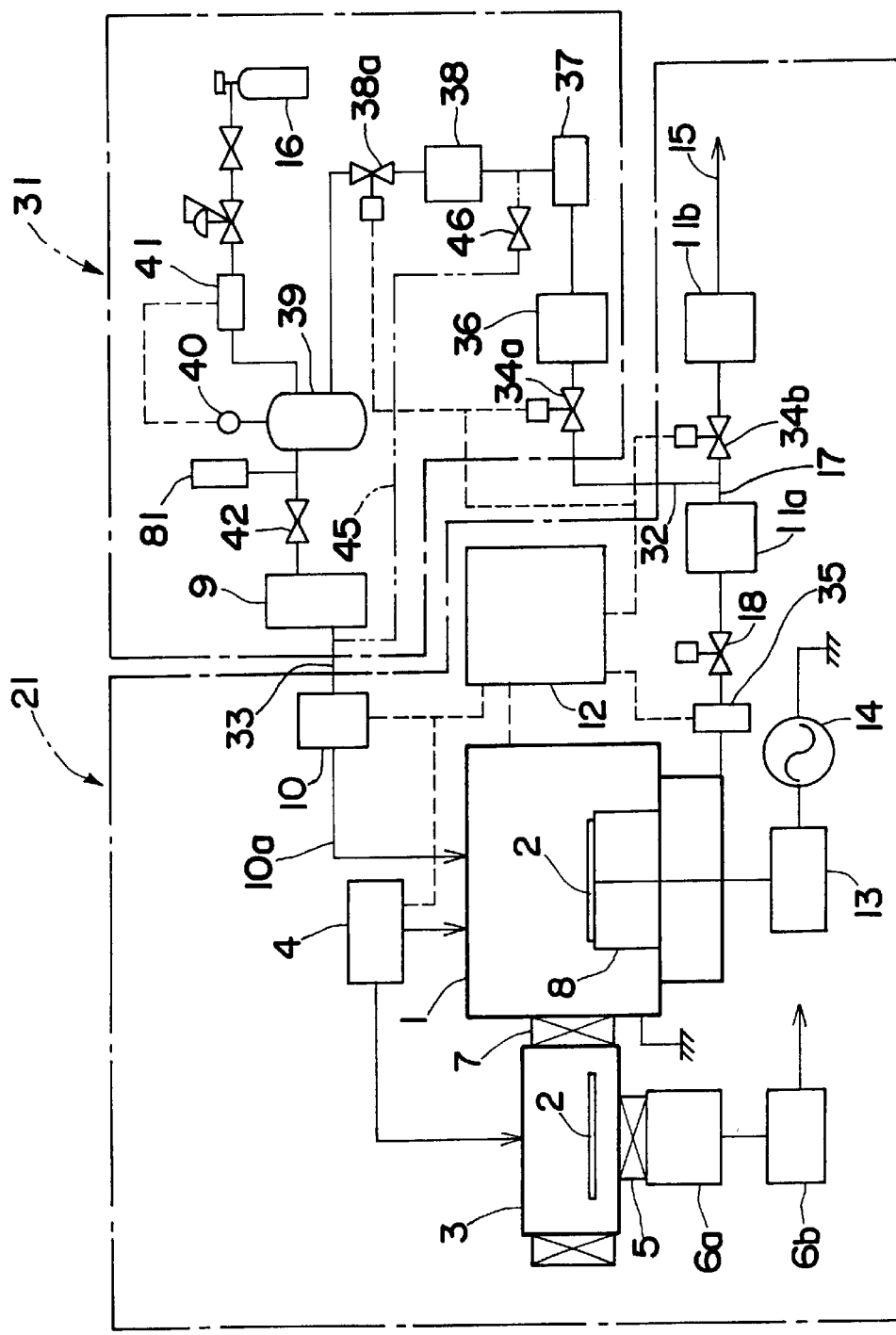
FIG. 1 is a system diagram showing an example in which the noble gas recovering apparatus of the present invention is applied to a sputtering system.
Figure 4:
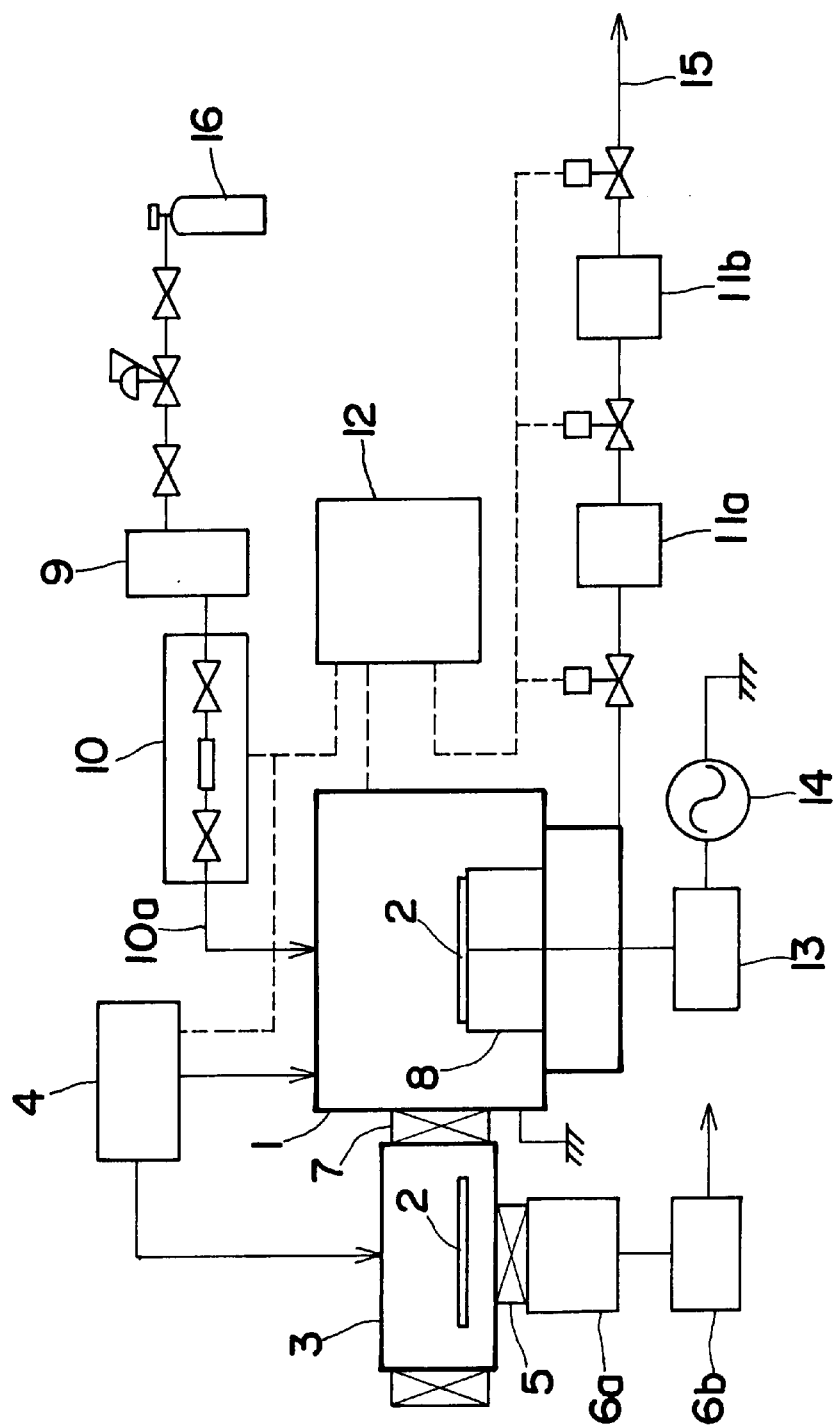
FIG. 4 is a system diagram showing an example of the conventional plasma treating system.
Figure 5:
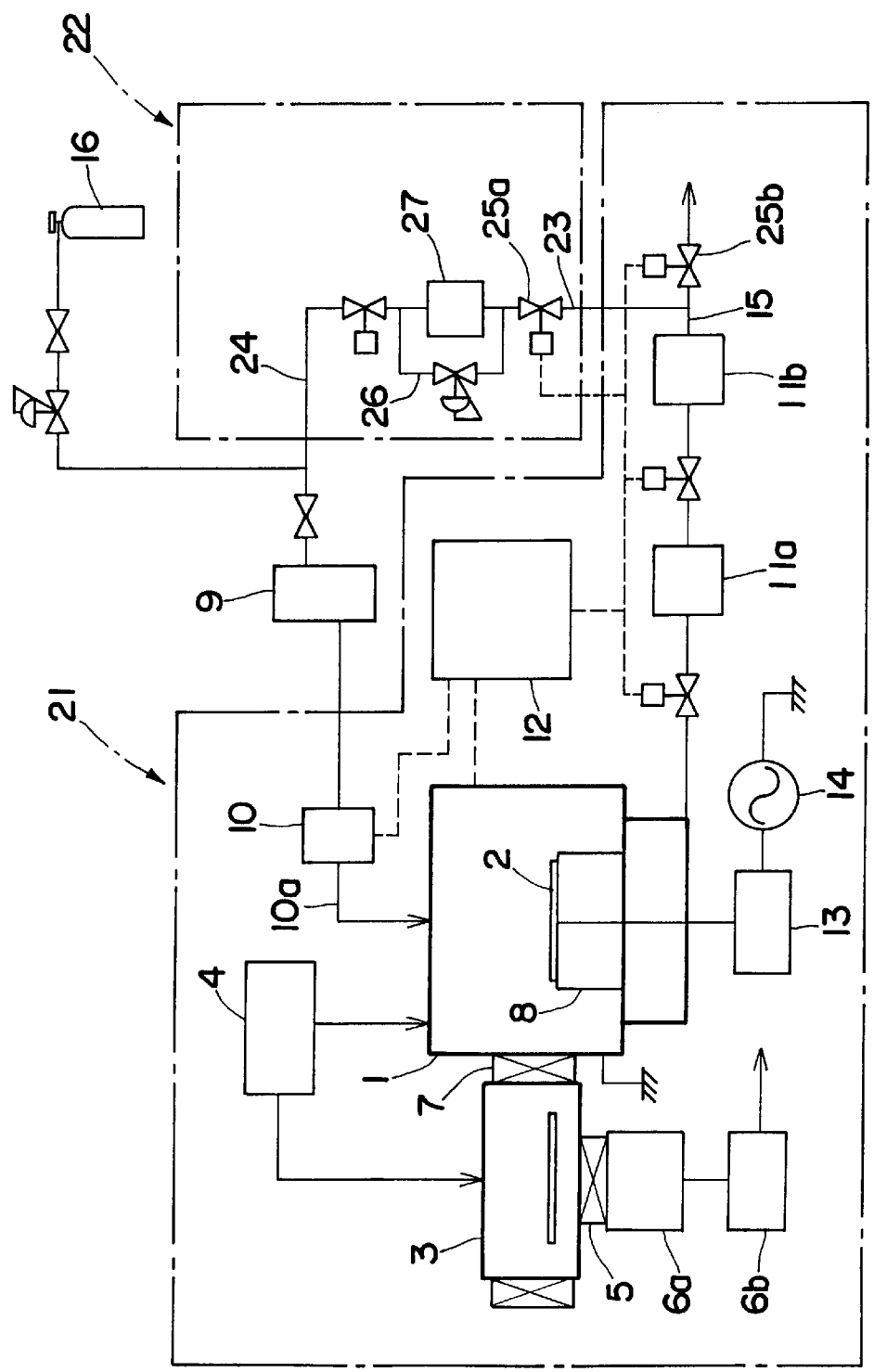
FIG. 5 is a system diagram showing an example where the conventional noble gas recovering apparatus is applied to the conventional plasma treating system shown in FIG. 4.

FIG. 1 is a system diagram showing an example in which the noble gas recovering apparatus of the present invention is applied to a sputtering system as the noble gas employing system. The constituents in the sputtering system are affixed with the same reference numbers as those of the counterparts in the sputtering system shown in FIG. 4, respectively, and detailed descriptions of them will be omitted.

This noble gas recovering apparatus 31 constitutes a closed loop for recovering a noble gas exhausted from a sputtering system 21 of the same constitution as described above to purify it and for feeding the thus purified noble gas back to the sputtering system 21. The noble gas recovering apparatus 31 is connected to the sputtering system 21 by a recovery line 32 branching out of a pressure reducing line 17 present between a first evacuator 11a for evacuating a process chamber 1 and a second evacuator 11b arranged downstream in series and by a noble gas supply line 33 for supplying the noble gas purified by a purifier 9 to a gas source 10.

The recovering line 32 and the pressure reducing line 17 are provided with a pair of selector valves 34a and 34b as line switching means for switching gas passages, respectively. These selector valves 34a and 34b are opened and closed in accordance with commands output from a controller 12 depending on the impurity content detected by a purity monitor 35 located on the outlet passage of the process chamber 1 and are operated interlocking with each other such that one is open and the other is closed. For example, the selector valves 34a and 34b are operated to be closed and opened respectively, if the purity monitor 35 detects an impurity content of more than 100 ppm, to let the exhaust gas out of the system by exhausting it to an exhaust system of the second evacuator 11b, whereas the valves 34a and 34b are operated to be opened and closed respectively, if the impurity content is 100 ppm or less, to introduce the exhaust gas into the recovering line of a recovery system. It should be noted, however, in the case where the impurity contains any component which can be removed by a remover (detoxicator) located on the recovery system even when the impurity content is high, such component shall be excluded from the impurity.

Incidentally, in the sputtering system 21 shown in this embodiment, a turbo-molecular pump is used as the first evacuator 11a, while a dry pump or a screw pump is used as the second evacuator 11b. The pressure in the pressure reducing line 17 is in the negative state of about 100 Pa. Meanwhile, the internal pressure of the process chamber 1 and that of a loading chamber 3 are set to be about 1 Pa (Pascal) and about 10 to 8 Pa, respectively.

The noble gas recovering apparatus 31 is provided with a recovery vacuum pump 36 for sucking an exhaust gas assuming a reduced pressure from the pressure reducing line 17, a remover 37 for removing metal particles contained in the exhaust gas, a compressor 38 for compressing the exhaust gas to a predetermined pressure, a buffer tank 39 for storing a predetermined pressure of exhaust gas, as well as, the purifier 9 and a noble gas tank 16 for supplementing the noble gas. It should be noted here that if the noble gas employing system is that which uses toxic components such as reactive gases, for example, a plasma CVD system and a reactive ion etching system, the toxic components contained in the exhaust gas must be removed, so that a detoxicator employing a detoxicating agent (reactive agent, adsorbent, etc.) is installed in addition to the remover 37. This detoxicator may constitute a separate body or may be integrated with the remover 37.

The process of the present invention will be described below based on the procedures of recovering a noble gas.

When the pressure of the loading chamber 3 becomes substantially equal to that of the process chamber 1 and a gate valve 7 interposed between these two chambers 3 and 1 is opened, an untreated wafer 2 present in the loading chamber 3 is first fed through the gate valve 7 to be mounted on a wafer susceptor 8 housed in the process chamber 1. In this step, a purge gas is supplied into the process chamber 1 from a purge gas source 4 so as to prevent inverse diffusion of impurity from the evacuation system and to maintain a reduced internal pressure in the process chamber 1 under flow of a purge gas. While nitrogen is usually used as the purge gas, the kind of purge gas is not limited to nitrogen but may be selected depending on the process.

Molecules of the gas in the process chamber 1 are exhausted, after the gate valve 7 interposed between the chamber 1 and the chamber 3 is closed, by the first evacuator (turbo-molecular pump) 11a connected to the process chamber 1 via a valve 18 and by the second evacuator (back pump) 11b connected in series to the first evacuator 11a. The impurity-free noble gas resulted after passing through the purifier 9 is then introduced through the noble gas source 10 into the process chamber 1 at a rate of 500 cc/min to form a noble gas atmosphere in the process chamber 1. A high-frequency wave is applied from a high-frequency power source 14 to cause plasma to be generated by high-frequency discharge. Plasma is generated generally under a pressure of 1 Pa. A solid film-forming material is sputtered by the thus generated plasma to be deposited onto the wafer 2 and form a thin film. The wafer 2 having a predetermined thin film formed thereon is forwarded from the process chamber 1 through the loading chamber 3 to the next process for another treatment. In this step, the noble gas used for deposition of the thin film is purged out of the process chamber 1 by the purge gas. Loading and unloading of wafers 2 are carried out about 20 times/hour according to the procedures as described above.

Meanwhile, the exhaust gas from the process chamber 1 is exhausted by evacuation through the valve 18 interposed between the process chamber 1 and the first evacuator 11a, and the impurity content of the exhaust gas is measured by the purity monitor 35 installed on the upstream side of the valve 18. In this step, since the impurity monitor 35 measures the impurity component in the noble gas, the monitor 35 is preferably of the type capable of in-situ measurement so as to improve the efficiency of recovering the noble gas. Further, since the measurement is carried out under reduced pressure, a mass analyzer is suitably used as the purity monitor 35, and the use of mass analyzer enables not only in-situ measurement but also less expensive measurement, since the noble gas need not be exhausted out of the system and since the analyzer can be installed merely by attaching a port to the exhaust piping.

It should be noted that while the purity monitor 35 is installed on the upstream side of the valve 18, it may be on the upstream side of the selector valves 34a and 34b. The purity monitor 35 employable here may be of various kinds so long as it permits in situ measurement under reduced pressure, and a spectral analyzer using FT-IR or laser as a light source can suitably be employed.

The content of impurities including oxygen, nitrogen, water, carbon monoxide, carbon dioxide, carbon fluoride, hydrogen and various film-forming gases contained in the exhaust gas is measured by the purity monitor 35, and measurement signals are transferred to the controller 12. When the impurity content (the content of impurities which cannot be removed by the remover 37) is, for example, 100 ppm or lower, preferably 10 ppm or lower, the selector valve 34b installed on the upstream side of the second evacuator 11b is closed, while the selector valve 34a installed on the recovering line 32 is opened, in response to the signal from the controller 12, and the flow of exhaust gas is switched from the pressure reducing line 17 assuming a reduced pressure to the recovering line 32 to introduce the exhaust gas containing primarily the noble gas into the noble gas recovering apparatus 31. While it is also possible to carry out switching of the exhaust gas flow passage on the upstream side of the first evacuator 11a, a pump having a suction force comparable to that of the turbo-molecular pump should be used here as the recovery vacuum pump 36.

The exhaust gas to be introduced to the noble gas recovering apparatus 31 is sucked by the recovery vacuum pump 36 and is fed to the remover 37. The remover 37 in this embodiment is directed primarily to carry out removal of metal particles and consists mainly of metal filters. However, when toxic components contained in the exhaust gas are to be removed as described above, the remover 37 is incorporated mainly with a reactive agent for detoxicating reactive gas molecules by oxidation reactions, an adsorbent for adsorbing such molecules, etc. As the reactive agent, copper oxide, iron oxide, nickel oxide, platinum or a mixture thereof can be used, while activated carbon, alumina, synthetic zeolite, etc. can be used as the adsorbent. However, the reactive agents and adsorbents are not to be limited to those exemplified here. Further, when the reactive gas molecules are of a high-boiling point compound (b.p.$\geq -50°$ C.), a cooling jacket is suitably employed to remove the reactive gas molecules by liquefaction or solidification.

The exhaust gas having passed the remover 37 is introduced to the compressor 38 to be compressed there to a predetermined pressure, e.g. 1 to 8 kg/cm$^2$G. A reciprocating compressor is usually used nonlimitatively as the compressor 38. The compressed exhaust gas is fed through a valve 38a, which is located on the downstream side of the compressor 38 and interlocks with the selector valve 34a, and through a check valve (not shown) and is stored temporarily in the buffer tank 39.

A pressure sensor 40 is located in the buffer tank 39 so that a suitable pressure of noble gas is introduced gradually from the noble gas tank 16 through a pressure control unit 41 into the tank 39, when the pressure of the noble gas in the buffer tank 39 is lower than a predetermined pressure, e.g. less than 2 atm. While the capacity of the buffer tank 39 depends on the volume of the process chamber 1 and on the volume from the process chamber 1 to the second evacuator 11b, it may be at least equal to the volume from the process chamber 1 to the second evacuator 11b.

The noble gas stored in the buffer tank 39 is introduced through a valve 42 into the purifier 9 where impurities in the noble gas, e.g., moisture, nitrogen, oxygen, carbon monoxide, carbon dioxide, hydrogen and various kinds of hydrocarbons, are removed. While various types can be used as the purifier 9, for example, an adsorption type and membrane separation type, a getter type purifier employing a metal such as titanium, vanadium, zirconium, iron and nickel or an alloy of such metals is suitably used.

Since the content of impurities in the noble gas is measured by the purity monitor 35 when it is recovered, the impurity content of the noble gas to be introduced to the purifier 9 is already known. Usually, the performance (impurity removing efficiency) of the getter type purifier depends on the inlet impurity content and the superficial velocity. Accordingly, the superficial velocity should be reduced, or a larger getter column should be used, when the impurity content is 100 ppm or more, causing increase(e in the size of the purifier 9. Thus, if the impurity content is 100 ppm or less, desirably 10 ppm or less, the inside diameter of the getter column may be about 30 mm, provided that the standard processing flow rate is 1 l/min, enabling downsizing of the purifier 9. It is also possible to carry out optimized designing suitably depending on the necessary flow rate. If the purifier 9 is provided with an integrating flowmeter, which can calculate the getter life, the timing of replacing the getter can be estimated.

Further, when the purifier 9 is of the getter type, a circulation line 45 for circulating a gas from the outlet (noble gas supply line 33) of the purifier 9 to the upstream side of the compressor 38 is installed so as to supply the gas normally to it and prevent overheating of the getter. When no noble gas is to be introduced to the noble gas-using system (sputtering system 21), a valve 46 is opened to feed the noble gas in the purifier 9 back to the compressor 38 to circulate it through the buffer tank 39 to the purifier 9. Incidentally, the circulation line 45 may be located between the gas source 10 and the upstream side of the compressor 38.

The noble gas from which impurities were removed in the purifier 9 is introduced from the noble gas supply line 33 and through the gas source 10 to the process chamber 1 for recirculation. As described above, it is in the prepurge step immediately after a wafer 2 is introduced to the process chamber 1 and in the thin film deposition step under plasma generation that the noble gas is used. The amount of prepurge exhaust gas is about 0.2 $\lambda$ in the case of 200 mm wafers, and the noble gas is recovered depending on the impurity content. Meanwhile, the noble gas used in the thin film deposition step has a sufficiently low impurity content, so that the exhaust gas can be entirely recovered for recirculation.

As described above, since the greatest part of the noble gas used in the sputtering system 21 can be recovered for recirculation according to the present invention, a predetermined amount of noble gas can be used in a necessary purity inexpensively.

That is, by carrying out switching of the exhaust gas line to the recovery system or the exhaust system depending on the impurity content of the exhaust gas, the purifier 9 can be downsized, and also the life of it can be extended. Particularly, if this switching is carried out on the pressure reducing line 17 having a reduced internal pressure, the noble gas is prevented from dwelling in the pump and the like to enable efficient recovering of the noble gas exhausted from the process chamber 1. Further, as described above, the impurity content becomes low during the thin film deposition treatment, recovery and recirculation of the noble gas can be carried out efficiently by selecting the exhaust gas line depending on the running state of the sputtering system 21. In addition, not only a necessary amount of noble gas can securely be supplemented by feeding the noble gas from the noble gas tank 16 depending on the internal pressure of the buffer tank 39 in the recovery mode, but also purification of the noble gas can be carried out by a single purifier 9.

Incidentally, while the compressor 38 is usually operated at commercial frequency, the pressure on the upstream side of the compressor fluctuates depending on the switching over to the recovery system. Thus, in order to carry out an operation stably, it is necessary to form a bypass connecting the upstream side and the downstream side of the compressor and to install a pressure controller in this system. However, according to this method, the noble gas compressed in the compressor 38 is recompressed, so that the running cost for compression is increased occasionally. In order to reduce the compressor running cost, the compressor 38 is preferably provided with an inverter control mechanism. In this case, the compressor 38 can be operated in an optimum state based on signals from the pressure sensor disposed on the upstream side of the compressor 38. More specifically, when the upstream side pressure of the compressor is lower than the reference pressure, or when the amount of exhaust gas introduced to the recovery system is small, the pressure controller controls to provide a smaller frequency; whereas when the upstream side pressure of the compressor is higher than the reference pressure, the pressure controller controls to provide a greater frequency. Thus, the upstream side pressure of the compressor can be controlled constantly at a fixed level, while the power consumption in the compressor 38 is reduced, leading to elongation of the life of the compressor 38.

Figure 2:
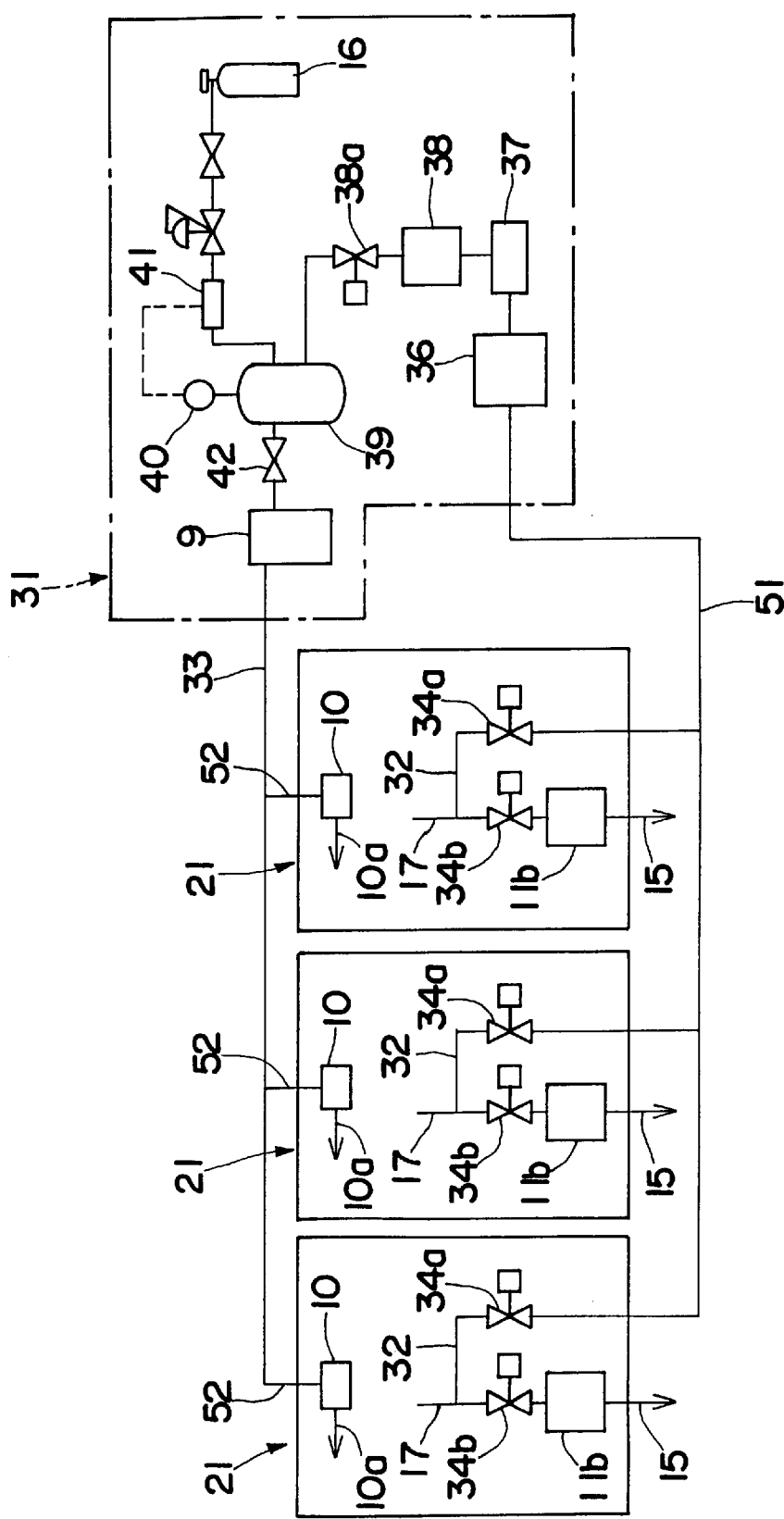
FIG. 2 is a system diagram of pertinent portions showing an example of connection when the noble gas recovering apparatus of the present invention is applied to a plurality of noble gas employing systems.

FIG. 2 shows an example where a plurality of noble gas employing systems, for example, three sputtering systems 21 are connected to a noble gas recovering apparatus 31. More specifically, three recovering lines 32 branching out of pressure reducing lines 17 of the sputtering systems 21 are connected on the downstream sides of selector valves 34a to a single main recovering line 51, respectively. The main recovering line 51 is connected to a recovery vacuum pump 36, and a noble gas supply line 33 is connected via branch lines 52 to the sputtering systems 21 respectively. Incidentally, since the major constituents of the noble gas recovering apparatus and of the noble gas employing systems shown in this embodiment can be formed like the counterparts in the noble gas recovering apparatus 31 and the sputtering system 21 shown in FIG. 1, the same or like constituents are affixed with the same reference numbers respectively, and detailed description of them will be omitted. Each sputtering system 21, like the sputtering system 21 shown in FIG. 1, is provided with a process chamber 1, a loading chamber 3, a purge gas source 4, a gate valve 5, evacuators 6a and 6b, a gate valve 7, an evacuator 11a, a controller 12, a matching circuit 13, a high-frequency power source 14, a valve 18, a purity monitor 35, etc.

While the noble gas recovering apparatus 31 has the same constitution, function and behavior as described above, the apparatus 31 can be operated in a stable state by adjusting the running cycle in each sputtering system 21. That is, provided that the time required for carrying out a series of steps, wafer in—film formation—wafer out, in each sputtering system 21 is t, each plasma treating system is started with a time lag t/3. Thus, the amount of exhaust gas to be recovered through the main recovering line 51 can be leveled to enable stable running of the compressor 38, and the amount of noble gas to be supplied from the purifier 9 through the noble gas supply line 33 can also be leveled. It should be noted here that the time-lag cycle (t/3) can be suitably set depending on the noble gas employing system and on the processing time, and a desired optimum time-lag cycle can be selected.

Incidentally, in the case where it is difficult to operate the noble gas recovering apparatus 31 stably only by the cycle adjustment, the vent flow rate in the gas source 10 of each sputtering system 21 is adjusted, and thus the noble gas recovering apparatus 31 can be operated in a more stable state.

Figure 3:
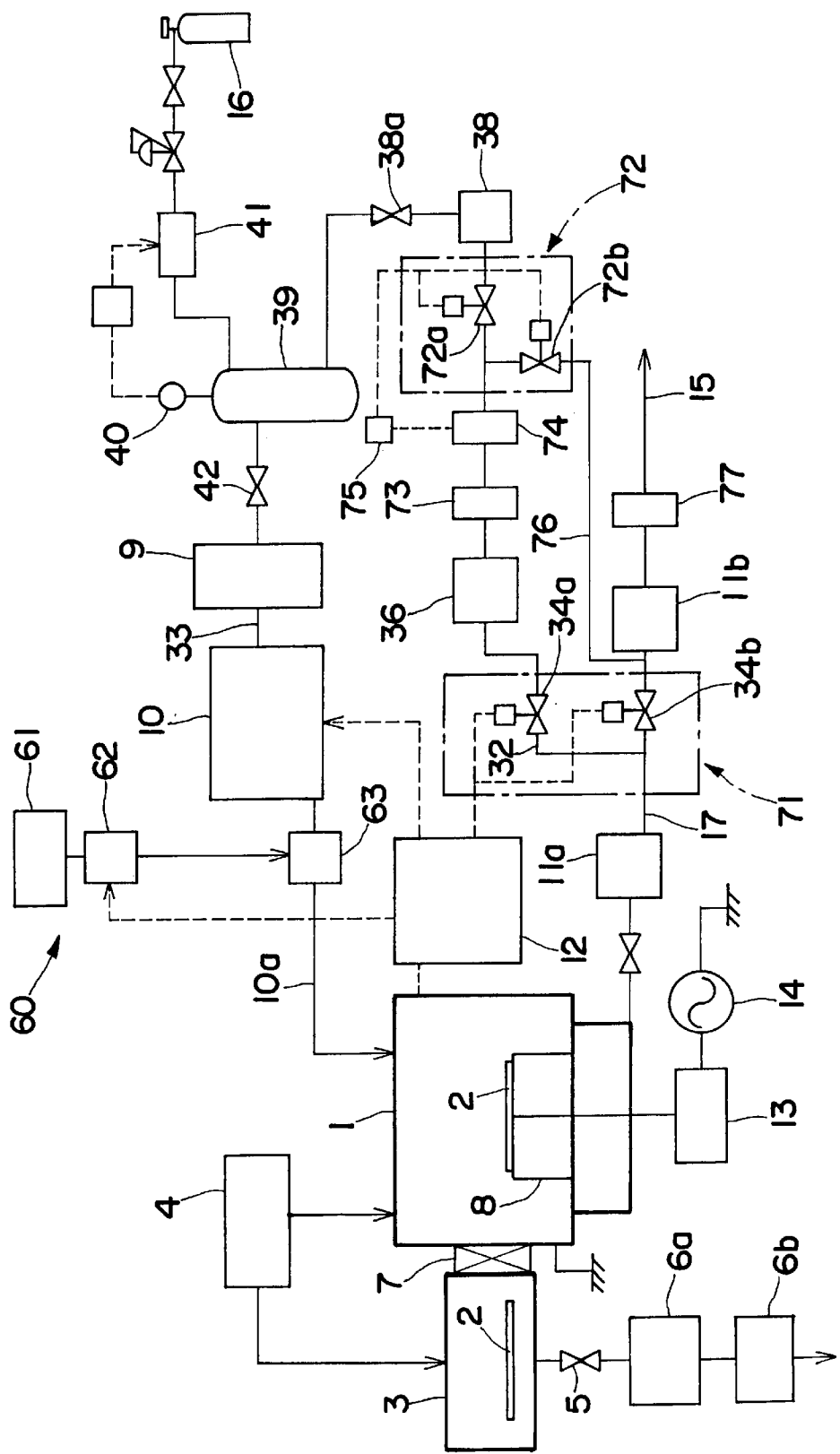
FIG. 3 is a system diagram showing an example where the noble gas recovering apparatus of the present invention is applied to a noble gas employing system which uses a film-forming gas.

FIG. 3 is a system chart showing one embodiment of the noble gas recovering apparatus optimized for a noble gas employing system where a mixture of a film-forming gas such as a reactive gas and an etching gas with a noble gas is used, for example, a plasma CVD system and a reactive ion etching system. Incidentally, since the major constituents of the noble gas recovering apparatus and of the noble gas employing system shown in this embodiment can be formed like the counterparts in the noble gas recovering apparatus 31 and the noble gas employing system (sputtering system 21) shown in FIG. 1, the same or like constituents are affixed with the same reference numbers respectively, and detailed description of them will be omitted.

First, in the noble gas employing system, a gas source 10 is provided on the downstream side with a film-forming gas supply line 60, and a noble gas supplied from the gas source 10 is mixed in a mixer 63 with a film-forming gas, for example, reactive gases and etching gases such as, reactive gases and various kinds of doping gases including monosilane, ammonia and phosphine, to be supplied via a flow rate regulator 62 from a film-forming gas source 61, and the resulting mixed gas formed in this mixer 63 is designed to be supplied to a process chamber 1.

Meanwhile, the noble gas recovering apparatus is provided with a first line switching means 71 consisting of selector valves 34a and 34b as described above and also with a second line switching means 72 consisting of a pair of selector valves 72a and 72b, with a detoxicator 73 and a purity monitor 74 being interposed between the upstream side of the second line switching means 72 and a recovery vacuum pump 36. In the second line switching means 72, a controller 75 is adapted to interlock the selector valves 72a and 72b with each other to be open and closed or vice versa, respectively, depending on the purity of the noble gas or impurity content detected by the purity monitor 74, so that the selector valve 72a and the selector valve 72b are operated to be open and closed respectively when the impurity content is low enough; whereas the selector valve 72b and the selector valve 72a are operated to be open and closed respectively when the impurity content is high.

In the apparatus having such a constitution, in the step where neither noble gas nor film-forming gas is introduced into the process chamber 1 such as during exchange of wafers 2, the recovery side selector valve 34a and the exhaust side selector valve 34b in the first line switching means 71 are closed and opened respectively. The purge gas, for example, a nitrogen gas, supplied into the process chamber 1 and sucked by a turbo-molecular pump 11a to be led into a pressure reducing line 17 is exhausted out of the system via the selector valve 34b, a back pump 11b and through the exhaust passage 15.

Upon initiation of introduction of the noble gas and the film-forming gas into the process chamber 1, the postures of the selector valves 34a and 34b of the first line switching means 71 are switched to each other, and the exhaust gas flowing through the pressure reducing line 17 is sucked through the selector valve 34a by the recovery vacuum pump 36. The exhaust gas flowed out of the recovery vacuum pump 36 flows into the detoxicator 73 where components to be removed including metal particles, reactive gas, etc. are removed or detoxicated, and then purity (impurity content) of the thus treated noble gas is measured by the purity monitor 74. Incidentally, in this embodiment, since the purity monitor 74 is located on the downstream side line (assuming atmospheric pressure) of the recovery vacuum pump, a gas chromatograph and the like can be used in addition to the various kinds of equipment. as described above.

The impurity content measured by the purity monitor 74 is fed to the controller 75 which operates the selector valves 72a and 72b of the second line switching means 72 to be open and closed or vice versa respectively depending on the impurity content, as described above. In the case of an exhaust gas having a low impurity content, it flows through the selector valve 72a, and after compression in the compressor 38 to a predetermined pressure level, the resulting compressed gas is stored temporarily in the buffer tank 39, purified in a purifier 9 and supplied again from a noble gas supply line 33 and through the gas source 10 and the mixer 63 into the process chamber 1.

In the case of an exhaust gas having a high impurity content, it is returned through the exhaust line 76 by opening the selector valve 72b and closing the selector valve 72a to the upstream side of the back pump 11b. Incidentally, in this embodiment, an auxiliary detoxicator 77 is installed on the exhaust passage 15 considering possible presence of the residual film-forming gas, as the impurity contained in the gas to be exhausted out of the system through the exhaust line 76 and from the back pump 11b, which failed to be detoxicated, or migration of such film-forming gas remaining in the system into the exhaust system when the selector valve 34b is open. Thus, the auxiliary detoxicator 77 is adapted to carry out detoxication treatment of the exhaust gas.

TEST EXAMPLE 1

A noble gas employing system and a noble gas recovering apparatus having the constitutions as shown in FIG. 1 were used to recover xenon gas, and the recovery rate was measured. The xenon gas recovery rate was calculated based on the fresh charge amount measured by a flowmeter disposed on the downstream side of the pressure control unit 41 and on the flow rate of the gas consumed in the gas source 10. Major parts constituting the noble gas recovering apparatus are as specified below:

Purifier 9: Ti alloy getter type; allowable pressure 10 kg/cm$^2$; consumption flow rate 1 $\lambda$/min;

Buffer tank 39: SUS316L type, capacity 15 $\lambda$; allowable pressure 10 kg/cm$^2$;

Pressure control unit 41: Piezo control type, pressure control range 1.5 to 9.5 kg/cm$^2$;

Compressor 38: reciprocating type; max. compression power 8 kg/cm$^2$; withstand pressure 15 kg/cm$^2$.

Prior to the recovering operation, the noble gas recovering apparatus was started up according to the following procedures. the pressure control unit 41, buffer tank 39, compressor 38 and purifier 9 were evacuated by a vacuum pump of a helium leak detector 81 connected to the downstream side of the buffer tank 39 as shown in FIG. 1 to carry out a helium leak test. Next, xenon gas was introduced through the pressure control unit 41 from the noble gas tank 16 into the respective elements with the internal pressure of each element being maintained under vacuum. The xenon gas introduction pressure was raised up to 3 kg/cm$^2$ under measurement by a pressure sensor. The purifier 9 and the compressor 38 were then started up, and the process chamber 1 was evacuated up to 10$^{-7}$ Pa. Using the thus started noble gas recovering apparatus, a noble gas exhausted from a magnetron sputtering system employed as a noble gas employing system was recovered.

In the magnetron sputtering system, aluminum was used as a film-forming solid material. Meanwhile, the gate valve interposed between the process chamber and the loading chamber was operated only during loading and unloading of wafers, and the wafer loading/unloading time was 30 sec. Before loading/unloading wafers, nitrogen gas was introduced as a purge gas into the loading chamber and the process chamber to provide a pressure of 1 Pa. After a wafer was loaded in the process chamber, xenon gas was introduced at a rate of 1,500 cc/min for 10 seconds to carry out prepurging. Subsequently, plasma was generated under a pressure of 1 Pa and with a xenon gas flow rate of 1,500 cc/min to carry out a film formation treatment for one minute. The above procedures were repeated to treat 6-inch wafers at a rate of 36 pcs./hour. In this test, since evacuation was carried out under constant flow of the xenon gas into the process chamber, inverse diffusion from the evacuation system was prevented, so that the treated wafers came to have a substantially fixed aluminum specific resistance.

It was confirmed by the purity monitor that the xenon gas was replaced by the nitrogen gas in several seconds with loading/unloading of wafers in and out of the process chamber. Likewise, in the prepurging step, impurities containing primarily nitrogen gas were replaced by the xenon gas. Although impurity content dropped to 10 ppm or less in the middle of the prepurging step, the xenon gas was not recovered in this step, but was recovered only during the film formation step. The amount of xenon gas introduced afresh to the system was 9,000 cc/hour. Since the total amount of the gases introduced to the process chamber was 63,000 cc, the recovery rate is about 86%.

TEST EXAMPLE 2

A plasma CVD system for forming polycrystalline silicon films was used as the noble gas employing system. To describe the constitution of the plasma CVD system employed here, a film-forming gas supply line 60 as shown in FIG. 3 was located on the downstream side of the gas source 10 in the constitution of the system shown in FIG. 1, and monosilane was used as the film-forming gas. The substrate was a 300 mm square glass substrate, and the substrate temperature was 300° C. The gate valve interposed between the process chamber and the loading chamber was operated only during loading and unloading of wafers, and the wafer loading/unloading time was 30 seconds. Before loading/unloading wafers, nitrogen gas was introduced into the loading chamber and process chamber to provide a pressure of 100 Pa. After a wafer was loaded in the process chamber, xenon gas and monosilane gas were introduced at a ratio of 10:1 and at a flow rate of 1,000 cc/min for 10 seconds to effect prepurging. Subsequently, film formation was carried out for 110 seconds under a pressure of 100 Pa and under flow of xenon gas/monosilane gas=100:1 at a total flow rate of 3,000 cc/min. The above procedures were repeated to treat wafers at a rate of 24 pcs./hour. In this test, film formation was carried out under changing of the total flow rate from 300 cc/min to 3,000 cc/min to determine the surface flatness and uniformity of the resulting film and also crystal grain size of the polycrystalline silicon. As a result, the thin film formed at the flow rate of 3,000 cc/min showed most excellent properties.

It was confirmed by the purity monitor that the xenon gas was replaced by the nitrogen gas in several seconds with loading and unloading of wafers to and from the process chamber and that impurities containing primarily nitrogen gas were replaced by the xenon gas and monosilane gas in the prepurging step. Recovery of the xenon gas was started with the timing that the content of impurities other than the monosilane gas dropped to 10 ppm or less in the middle of the prepurging step. No monosilane gas component was observed in the exhaust gas during film formation. This is because the monosilane gas was fully decomposed by the high-density plasma. The amount of xenon gas introduced afresh to the system was 3,960 cc/hour. Since the total amount of the gases introduced to the process chamber was 134,650 cc, the recovery rate is about 97%.

TEST EXAMPLE 3

A plasma CVD system for forming doped polycrystalline silicon films was used as the noble gas employing system.

Like in Test Example 2, a film-forming gas supply line was added to an apparatus having the constitution as shown in FIG. 1, and monosilane and phosphine were used as the film-forming gas and as the doping gas, respectively. The substrate was a 300 mm square glass substrate, and the substrate temperature was 300° C. The gate valve interposed between the process chamber and the loading chamber was operated only during loading and unloading of wafers, and the wafer loading/unloading time was 30 seconds. Before loading/unloading wafers, nitrogen gas was introduced into the loading chamber and the process chamber to provide a pressure of 100 Pa. After a wafer was loaded in the process chamber, there were introduced xenon gas/monosilane gas/phosphine gas=100,000:1,000:1 at a flow rate of 1,000 cc/min for 10 seconds to effect prepurging. Subsequently, film formation was carried out for 160 seconds under flow of xenon gas/monosilane gas=100:1 at a total flow rate of 3,000 cc/min. The above procedures were repeated to treat wafers at a rate of 18 pcs./hour.

The xenon gas was replaced by the nitrogen gas in several seconds with loading and unloading of wafers to and from the process chamber. In the prepurging step, impurities containing primarily nitrogen gas were replaced by the xenon gas and monosilane gas. Although the content of impurities other than the monosilane gas and phosphine gas dropped to 10 ppm or less in the middle of the prepurging step, the xenon gas was not recovered during the prepurging step but recovered only during the film formation step. Neither monosilane gas component nor phosphine gas component was observed in the exhaust gas during film formation. This is because the monosilane gas and phosphine gas were fully decomposed by the high-density plasma. The amount of xenon gas introduced afresh to the system was 2,970 cc/hour. Since the total amount of the gases introduced to the process chamber was 145,540 cc, the recovery rate is about 98%.

TEST EXAMPLE 4

A plasma CVD system for forming silicon nitride films was used as the noble gas employing system in the constitution shown in FIG. 3, and monosilane and ammonia were used as the film-forming gas. The substrate was a 300 mm square glass substrate, and the substrate temperature was 300° C. The gate valve interposed between the process chamber and the loading chamber was operated only during loading and unloading of wafers, and the wafer loading/unloading time was 30 seconds. Before loading/unloading wafers, nitrogen gas was introduced into the loading chamber and the process chamber to provide a pressure of 100 Pa. After a wafer was loaded in the process chamber, there were introduced xenon gas/monosilane gas/ammonia gas= 100:1:5 at a flow rate of 1,000 cc/min for 10 seconds to carry out prepurging. Subsequently, film formation was carried out for 160 seconds under a pressure of 100 Pa and under flow of xenon gas/monosilane gas/ammonia gas=100:1:5 at a total flow rate of 3,000 cc/min. The above procedures were repeated to treat wafers at a rate of 18 pcs./hour.

The processing gas containing primarily xenon gas was replaced by the nitrogen gas in several seconds with loading and unloading of wafers to and from the process chamber. In the prepurging step, impurities containing primarily nitrogen gas were replaced by the xenon gas, monosilane gas and ammonia gas. The xenon gas was not recovered during the prepurging step but recovered only during the film formation step. In a preliminary test carried out beforehand, although no monosilane gas component was detected in the exhaust gas during film formation, about 1,000 ppm of ammonia gas component was detected. The nitrogen gas component was 100 ppm or less. Since the ammonia gas is designed to be removed by the detoxicator disposed on the downstream side of the recovery vacuum pump, the xenon gas can be recovered from the exhaust gas during the film formation step even if the ammonia content is high. Since the amount of xenon gas introduced afresh to the system was 2,830 cc/hour and the total amount of the gases introduced to the process chamber was 135,850 cc, the recovery rate is about 98%.

TEST EXAMPLE 5

Argon gas was used as the noble gas in place of xenon gas, and a reactive ion etching system for etching boron phospho-silicate glass (BPSG) was used as the noble gas employing system. $C_4F_8$, carbon monoxide and oxygen were used as an etching gas. The substrate was an 8-inch Si wafer having a 1.5 $\mu$m BPSG film deposited thereon. A masking material called resist was applied onto the substrate to a thickness of 0.7 $\mu$m, followed by light exposure and developing processes to form a 0.18 $\mu$m-diameter hole pattern in the masking material. The constitution of the system was the same as in Test Example 2.

The gate valve interposed between the process chamber and the loading chamber was operated only during loading and unloading of wafers, and the wafer loading/unloading time was 30 seconds. Before loading/unloading wafers, nitrogen gas was introduced into the loading chamber and the process chamber to provide a pressure of 5 Pa. After a wafer was loaded in the process chamber, there was introduced a gas containing $C_4F_8$: 5%, CO: 15%, oxygen: 2% and argon 78% in terms of gas ratio at a total flow rate of 500 cc/min for 10 seconds to effect prepurging. Subsequently, etching was carried out for one minute under a pressure of 5 Pa and under flow of the processing gas having the above gas ratio at a total flow rate of 1,000 cc/min. The above procedures were repeated to treat wafers at a rate of 36 pcs./hour.

The processing gas was replaced by the nitrogen gas in several seconds with loading and unloading of wafers to and from the process chamber. In the prepurging step, the nitrogen gas was replaced by the processing gas. However, the argon was not recovered during the prepurging step. In a preliminary test carried out beforehand, although the C-F compound, $SiF_4$, carbon dioxide and argon were mainly observed as gaseous components during film formation, oxygen was consumed for oxidation of CO and resist arid was not significantly detected. Since the reactive gas molecules other than those of oxygen and argon can be removed by the detoxicator, the argon gas was recovered during the film formation irrespective of the contents of these components. Since the amount of argon gas introduced afresh to the system was 2,380 cc/hour and the total amount of the gases introduced to the process chamber was 30,420 cc, the recovery rate is about 92%.

What is claimed is:

1. A process for recovering a noble gas, which comprises, in recovering a noble gas contained in an exhaust gas exhausted from a noble gas employing system operated under reduced pressure, carrying out an operation of switching between introduction of the exhaust gas to a recovery system and exhaustion of the exhaust gas to an exhaust system depending on the content of impurity components contained in the exhaust gas.

2. The process for recovering a noble gas, which comprises, in recovering a noble gas contained in an exhaust gas exhausted from a noble gas employing system operated under reduced pressure, carrying out an operation of switching between introduction of the exhaust gas to a recovery system and exhaustion of the exhaust gas to an exhaust system under reduced pressure.

3. The process for recovering a noble gas according to claim 2, wherein the operation of switching between introduction of the exhaust gas to a recovery system and exhaustion of the exhaust gas to an exhaust system is carried out depending on the content of impurity components contained in the exhaust gas.

4. The process for recovering a noble gas according to claim 2, wherein the operation of switching between introduction of the exhaust gas to a recovery system and exhaustion of the exhaust gas to an exhaust system is carried out depending on the running state of the noble gas employing system.

5. An apparatus for recovering a noble gas, comprising:
a noble gas employing system operated under reduced pressure;
a first evacuator for sucking an exhaust gas let out from the noble gas employing system;
a second evacuator disposed in series on the downstream side of the first evacuator via a pressure reducing line;
a recovering line branching out of the pressure reducing line via line switching means;
a recovery vacuum pump located on the recovering line;
a compressor for compressing a recovered gas delivered from the recovery vacuum pump;
a buffer tank for storing the thus compressed recovered gas;
a purifier which removes impurities in the recovered gas let out from the storage tank to purity the noble gas; and
a noble gas supply line for supplying the purified noble gas to the noble gas employing system.

6. The apparatus for recovering a noble gas according to claim 5, wherein a detoxicator for detoxicating target harmful components contained in the recovered gas let out from the recovery vacuum pump is interposed between the recovery vacuum pump and the compressor.

7. The apparatus for recovering a noble gas according to claim 6, wherein impurity content detecting means for measuring the impurity content in the recovered gas is disposed on the downstream side of the detoxicator; and an exhaust line for exhausting the recovered gas depending on the impurity content measured is branched via line switching means out of a passage between the impurity content detecting means and the compressor.

8. The apparatus for recovering a noble gas according to claim 5, wherein the buffer tank is provided with pressure detecting means; the apparatus further comprising noble gas supplementing means for introducing the noble gas into the buffer tank depending on the value detected by the pressure detecting means.

* * * * *